US010185691B2

(12) United States Patent
Hua et al.

(10) Patent No.: US 10,185,691 B2
(45) Date of Patent: Jan. 22, 2019

(54) TWO-DIMENSIONAL TORUS TOPOLOGY (71) Applicant: Hewlett-Packard Development Company, L.P., Houston, TX (US)

(72) Inventors: Chanh V. Hua, Houston, TX (US); Dwight L. Barron, Houston, TX (US); Siamak Tavallaei, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 90 days.

(21) Appl. No.: 14/903,256

(22) PCT Filed: Jul. 30, 2013

(86) PCT No.: PCT/US2013/052766
§ 371 (c)(1),
(2) Date: Jan. 6, 2016

(87) PCT Pub. No.: WO2015/016841
PCT Pub. Date: Feb. 5, 2015

(65) Prior Publication Data
US 2016/0140072 A1 May 19, 2016

(51) Int. Cl.
*H05K 7/10* (2006.01)
*G06F 13/40* (2006.01)
(Continued)

(52) U.S. Cl.
CPC ............ *G06F 13/4068* (2013.01); *G06F 1/16* (2013.01); *G06F 13/4022* (2013.01); *H05K 7/1459* (2013.01)

(58) Field of Classification Search
None
See application file for complete search history.

(56) References Cited

U.S. PATENT DOCUMENTS 4,700,274 A * 10/1987 Laut ..................... G06F 13/409
361/729
5,359,714 A * 10/1994 Avaneas ................ G06F 13/409
710/100
(Continued)

FOREIGN PATENT DOCUMENTS

JP       2009289256 A     12/2009

OTHER PUBLICATIONS

Sibai, F.N., "A Two-dimensional Low-diameter Scalable On-chip Network for Interconnecting Thousands of Cores"; pp. 193-201; vol. 23; Issue: 2; Feb. 2012.
(Continued)

*Primary Examiner* — Hyun Nam
(74) *Attorney, Agent, or Firm* — Rathe Lindenbaum LLP (57) ABSTRACT

A printed circuit board with a two-dimensional torus topology provided herein. The printed circuit board includes an array of board connectors, an input port and an output port, and a set of interconnections. Each board connector of the array of board connectors is formed to receive an electronic connector. The input port and the output port are formed on each board connector to provide an identical trace routing direction. The set of interconnections are formed to connect each board connector to another board connector. The signal path between each of the interconnections has a length less than a distance between a first board connector and a last board connector in the array of board connectors.

23 Claims, 7 Drawing Sheets

(51) Int. Cl.
  *G06F 1/16*    (2006.01)
  *H05K 7/14*    (2006.01)

(56) References Cited

U.S. PATENT DOCUMENTS

| | | |
|---|---|---|
| 5,583,990 A | 12/1996 | Birrittella et al. |
| 2002/0145782 A1* | 10/2002 | Strasser ............. G02B 6/29367 398/83 |
| 2003/0016512 A1 | 1/2003 | McCall et al. |
| 2007/0140280 A1 | 6/2007 | Rhim et al. |
| 2007/0205498 A1* | 9/2007 | Djordjevic ............. H01P 3/081 257/698 |
| 2012/0020017 A1 | 1/2012 | Kehret et al. |
| 2012/0072607 A1* | 3/2012 | Kawashima ............ H04L 69/18 709/230 |
| 2013/0018947 A1 | 1/2013 | Archer et al. |
| 2013/0044588 A1 | 2/2013 | Kogge |
| 2014/0169211 A1* | 6/2014 | Harper .................... H04L 45/06 370/254 |
| 2014/0170865 A1* | 6/2014 | Peterson ................ H04Q 1/155 439/61 |
| 2015/0154140 A1* | 6/2015 | Coletrane ........... G06F 13/4086 710/301 |

OTHER PUBLICATIONS

International Search Report and Written Opinion dated Apr. 24, 2014, PCT Patent Application No. PCT/US2013/052766 dated Jul. 30, 2013 (ISA/KR).

\* cited by examiner

PROVIDE A PRINTED CIRCUIT BOARD WITH AN ARRAY OF BOARD CONNECTORS, EACH BOARD CONNECTOR INCLUDES AN INPUT PORT AND AN OUTPUT PORT, THE INPUT PORT AND THE OUTPUT PORT ARRANGED IN A UNIFORM POSITION ON EACH BOARD CONNECTOR

720

INTERCONNECT THE ARRAY OF BOARD CONNECTORS SUCH THAT THE CONNECTIONS FORMED BETWEEN THE INPUT PORT AND THE OUTPUT PORT PROVIDE A CONSISTENT TRACE ROUTING DIRECTION TO ENABLE EACH COMPUTE NODE TO BE INTERCHANGEABLY CONNECTED TO EACH BOARD CONNECTOR

TWO-DIMENSIONAL TORUS TOPOLOGY

CLAIM FOR PRIORITY

The present application is a national stage filing under 35 U.S.C. § 371 of PCT application number PCT/US2013/052766, having an international filing date of Jul. 30, 2013, the disclosure of which is hereby incorporated by reference in its entirety.

BACKGROUND

A two-dimensional torus topology is an interconnection topology used in high performance computing applications. The topology interconnects nodes in a mesh-like fashion where the nodes are connected to their left, right, above, and below neighbors with the end nodes looped around so each node is connected to four neighbors.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

To form a torus from a mesh topology, large systems using the two-dimensional torus topology require long wires between the end nodes or the nodes on the edge of the arrays. Completing the torus using long wires introduces signal integrity problems due to long trace length between the two end nodes. Adaptations to the two-dimensional torus topology include connecting every other node and bringing some of the nodes to the back of the topology to make the wires shorter in length. Connecting every other node doubles the connections and wire lengths which results in a drastic increase in the printed circuit board layers and increases the cost.

Bringing some of the nodes to the back of the topology changes the configuration of the input and output ports. For example, the change in the configuration connects two right facing ports to one another and/or two left facing ports to one another in some instances of the nodes while keeping the other nodes connected with one left facing port and one right facing port. The mapping of the ports is inconsistent when the configuration allows for the mating of left facing ports with other left facing ports and/or mating of right facing ports to other right facing ports in some instances and mating right facing ports and left facing ports in other instances. Moreover, such inconsistencies make it difficult to manage a mapping of nodes. Additionally, the topology adaptations connecting every other node and bringing some of the nodes to the back of the topology are not compatible with a system that includes nodes of varying widths and/or lengths that are connected to one another in a single system.

In examples, a printed circuit board with a two-dimensional torus topology is provided. The printed circuit board includes an array of board connectors, an input port and an output port, and a set of interconnections. Each board connector of the array of board connectors is formed to receive an electronic connector The input port and the output port are formed on each board connector to provide an identical trace routing direction. The set of interconnections are formed to connect each board connector to another board connector. The signal path between each of the interconnections has a length less than a distance between a first board connector and a last board connector in the array of board connectors.

As used herein, the phrase "electronic module" refers to a computing device such as a server, a blade server, or a server cartridge that provides computer solutions, storage solutions, network solutions and/or cloud services.

As used herein, the phrase "compute node" refers to data circuit terminating equipment (DCE), such as a modem, hub, bridge or switch; data terminal equipment (DTE); or a distributed system node, such as a client, a server or a peer device.

As used herein, the term "interconnection" refers to connection via for example a wire.

As used herein, the phrase "two-dimensional torus topology" refers to a network of nodes where each node is connected to more than one of the other nodes and all nodes are connected by a routing technique.

As used herein, the term "input port" refers to a connection point on a printed circuit board for an electronic device, such as an electronic module or compute node. The input port route the flow of interconnections into the port or connection on the printed circuit board. The input port may include, for example, a plurality of input pins, such as gold pins to form an electrical connection between the printed circuit board and the electronic device.

As used herein, the term "output port" refers to a connection point on a printed circuit board for an electronic device, such as an electronic module or compute node. The output port routes the flow of interconnections out of the port or connection on the printed circuit board. The output port may include, for example, a plurality of output pins, such as gold pins to form an electrical connection between the printed circuit board and the electronic device.

As used herein, the phrase "signal path" refers to the interconnection in a route that a signal travels between board connectors and slots.

As used herein, the phrase "shortened signal path" refers to a reduced or shorter route for signals to travel between board connectors and slots. For example, a length of an interconnection is shortened to reduce or shorten the signal path.

As used herein, the phrase "trace routing direction" refers to a direction of an interconnection between two slots. For example, a direction of the interconnection between an output port and the following input port on a printed circuit board.

As used herein, the phrases "identical trace routing direction," "same trace routing direction," and "consistent trace routing direction" refer to a symmetry between at least two trace routing directions. For example, each input port and each output port is located in the same position on all board connectors, slots, or nodes, such as all board connectors, slots, or nodes having the input ports and the output ports in the same position or in a symmetrical layout compared to one another.

As used herein, the phrase "physically adjacent" refers to interconnected positions physically adjacent or neighboring one another in physical space.

Figure 1:
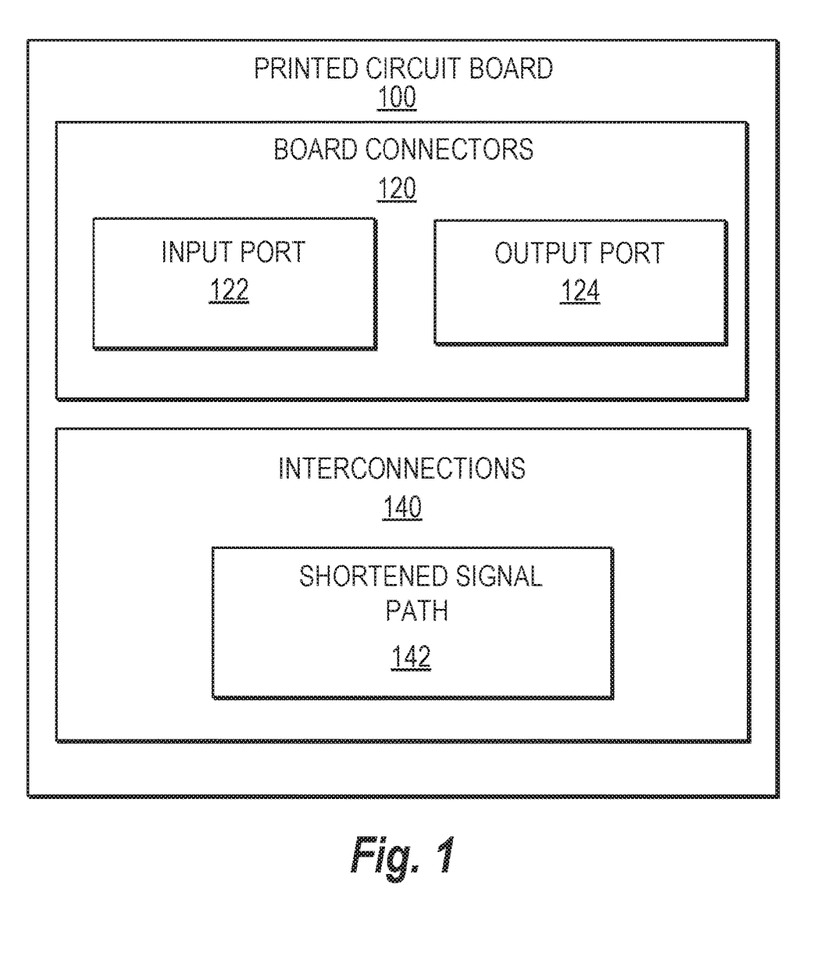
FIG. 1 illustrates a block diagram of a printed circuit board including a two-dimensional torus topology according to an example.

FIG. 1 illustrates a block diagram of a printed circuit board 100 including a two-dimensional torus topology according to an example. The printed circuit board 100 includes an array of board connectors 120 and a set of interconnections 140. Each board connector of the array of board connectors 120 is formed to receive an electronic module. An input port 122 and an output port 124 are formed on each board connector of the array of board connectors 120. For example, the input port includes a plurality of input pins, and the output port includes a plurality of output pins. The input ports 122 and the output ports 124 are arranged on each board connector to provide an identical trace routing direction for each board connector.

The set of interconnections 140 are formed to connect each board connector to another board connector in the array of board connectors 120. The set of interconnections 140 may include, for example, copper traces. Each interconnection of the set of interconnections 140 include a shortened signal path between a first board connector and a last board connector, the shortened signal path includes a length less than a distance between the first board connector and the last board connector in the array of board connectors 120, the first board connector and the last board connector are arranged at opposite ends of the printed circuit board 100.

Figure 2:
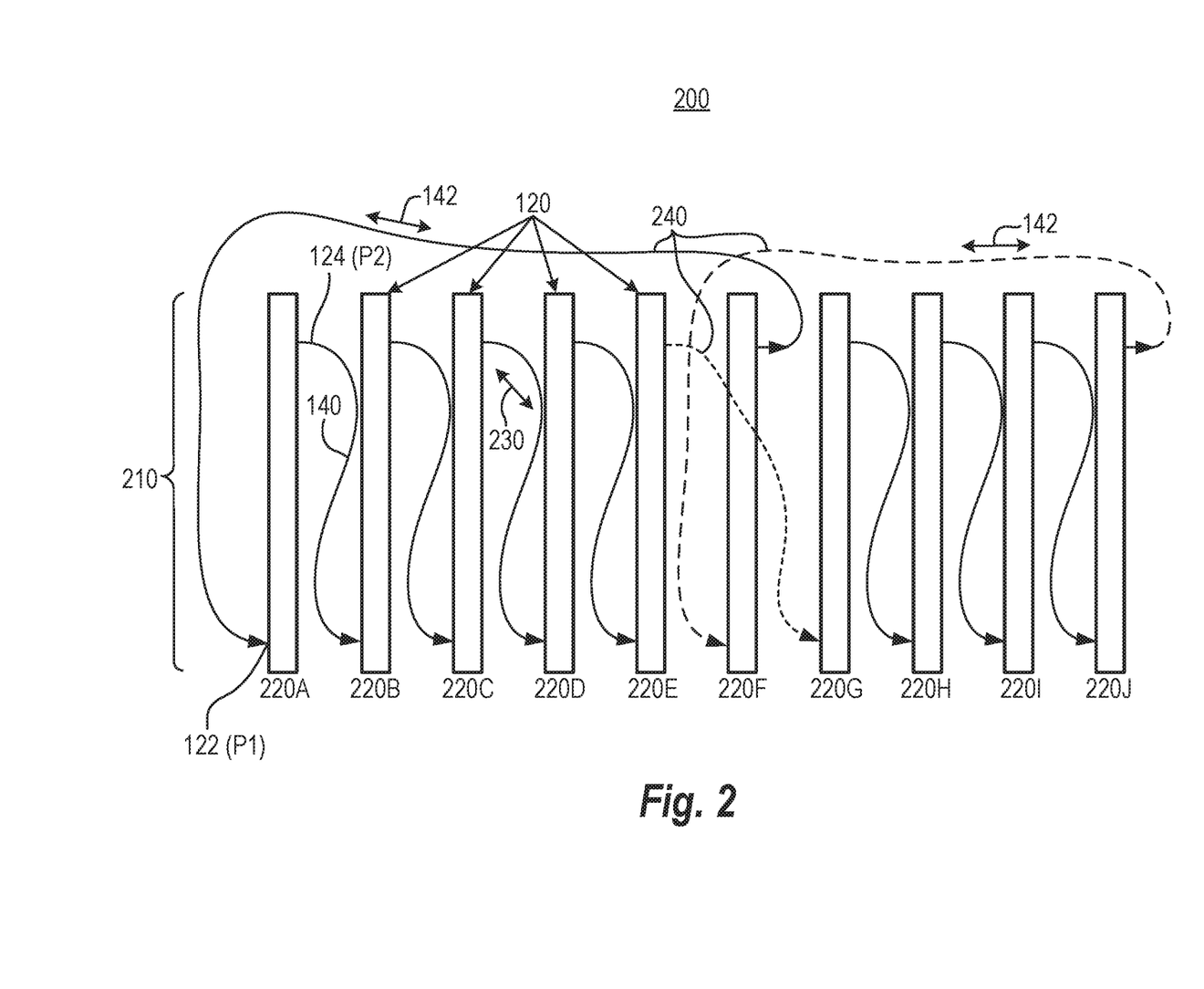
FIG. 2 illustrates a schematic diagram of the printed circuit board of FIG. 1 according to an example.

FIG. 2 illustrates a schematic diagram of the printed circuit board 100 of FIG. 1 according to an example. In the diagram, the printed circuit board 100 is, for example a motherboard with a two-dimensional torus topology 200 formed by the set of interconnections 140. The two-dimensional torus topology 200 forms a shortened signal path 142 between the first and the last board connectors along the two-dimensional torus topology 220A, 220J by not directly connecting the first and last board connectors 220A, 220J to one another. FIG. 2 illustrates three interconnections 240 not directly connected to the board connector 120 in the position physically adjacent thereto. The shortened signal path 142 comprises a percentage of a distance between a first board connector 220A and a last board connector 220J along a row 210 of the printed circuit board 100. The percentage is less than one-hundred percent.

The two-dimensional torus topology 200 illustrated also provides an identical trace routing direction 230 for each board connector 220. The input ports 122 are positioned at a first position P1 on each board connector 220, and the output ports 124 are positioned at a second position P2 on each board connector 220 to provide the identical trace routing direction 230 between the set of interconnections 140. FIG. 2 illustrates, for example, the input ports 122 in the first position P1 at the bottom of each board connector 220 and the output ports 124 in the second position P2 at the top of each board connector 220, in board connectors 220A-220J. The trace routing direction 230 is not a reference to the direction of signal. The trace routing direction 230 includes the routing flow of the interconnections 140, also referred to as traces between the board connectors 120. By having an identical trace routing direction 230 for each board connector 220, the routing wraps around the two-dimensional torus topology 200 to enable all board connectors to receive the same type of electronic module.

The input ports 122 to connect to an input electronic connector of the electronic module, and the output ports 124 to connect to an output electronic connector of the electronic module. The identical trace routing direction 230 enables the electronic modules to be interchangeably inserted into each board connector 220. For example, each board connector 120 may interchangeably receive electronic modules. The electronic module includes at least one module size selected from a single length and single width module, a double width module, a double length module, a triple length module, and a triple width module. The electronic modules may also include at least one module type selected from a network switch, a storage module, and a compute module interchangeably.

Figure 3:
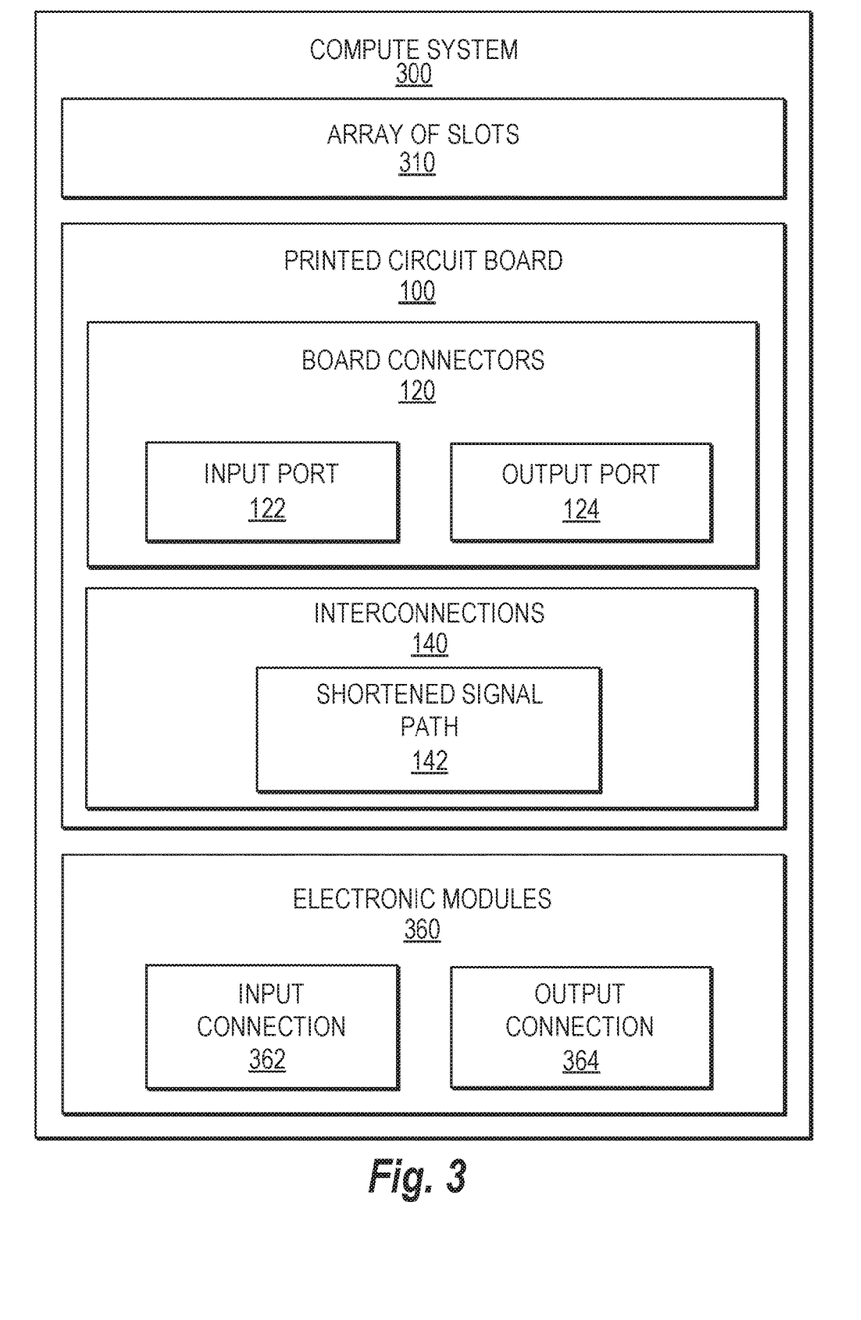
FIG. 3 illustrates a block diagram of a system with a two-dimensional torus topology according to an example.

FIG. 3 illustrates a block diagram of a system 300 with a two-dimensional torus topology 200 according to an example. The system 300 includes an array of slots 310, a printed circuit board 100, and a plurality of electronic modules 360. The array of slots 310 is formed to receive the plurality of electronic modules 360. The array of slots 310 are arranged on the printed circuit board 100 such that each slot in the array of slots 310 includes a board connector 220. Each board connector 220 includes an input port 122 and an output port 124. The input port 122 and the output port 124 are arranged on each board connector 220 and each slot 310 along a same trace routing direction 230. The set of interconnections 140 connect the input port 122 and the output port 124 to one another, such that each interconnection of the set of interconnections 140 include a length less than a distance between a first board connector and a last board connector in the array of board connectors 120 to provide a shortened signal path 142 therebetween, the first board connector and the last board connector arranged at opposite ends of the printed circuit board 100.

Each electronic module 360 is coupled to another electronic module 360 via the set of interconnections 140. Each electronic module has at least one input connection 362 and at least one output connection 364. The at least one input connection 362 is formed to connect to the corresponding input port 122 and the at least one output connection 364 is formed to connect to the corresponding output port 124.

Figure 4:
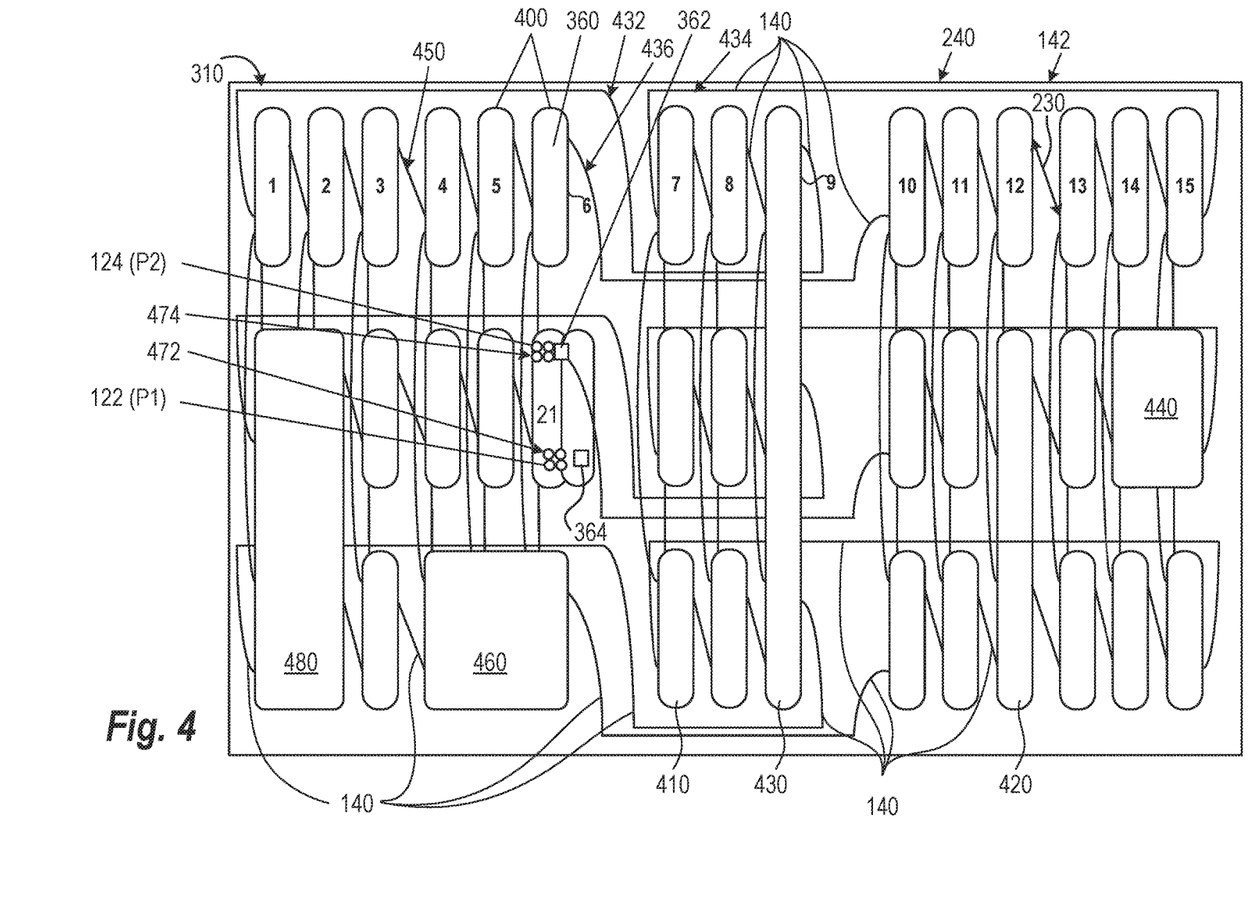
FIG. 4 illustrates a schematic diagram of the system of FIG. 3 according to an example.

FIG. 4 illustrates a schematic diagram of the system 300 of FIG. 3 according to an example. Referring to FIG. 4, each slot 400 in the array of slots 310 is illustrated to receive an electronic module 360. Each slot 400 includes a board connector with the input port 122 and the output port 124. The input port 122 and the output port 124 are arranged in each slot 400 along a same trace routing direction 230. For example, each slot 400 includes the input port 122 and the output port 124 arranged uniformly therein. The input port 122 are arranged in a uniform or the same input location, in the first position P1, in each slot 400 and the output ports 124 are arranged in a uniform or the same output location, in the second position P2, in each slot 400 as illustrated in FIG. 4.

The set of interconnections 140 that form along the same trace routing direction 230 include a shortened signal path. The length of at least one of the interconnections is reduced or shortened by directly connecting the first board connector, labeled slot 1, to another board connector between the second board connector, labeled slot 2, and the second to last board connector, labeled slot 14. Similarly, the last board connector, labeled slot 15, is directly connected to another board connector between the second board connector, labeled slot 2, and the second to last board connector, labeled slot 14. Using such an arrangement, at least one interconnection 240 of the set of interconnections 140 is not directly connected to the slot in a position physically adjacent thereto and the arrangement reduces or shortens a length of the set of interconnections 140 therebetween. The interconnections between adjacent slots, or the interior interconnections 450, may remain unchanged in most instances. The end slots or first slot, labeled slot 1, and last slot, labeled slot 15; however, will have a signal path with a length that is reduced or shorter, i.e., a reduced or shortened signal path 142. In other words, the reduced or shortened signal path 142 is a percentage less than one-hundred percent of a distance between a first board connector associated with a first slot, labeled slot 1, and a last board connector associated with a last slot, labeled slot 15.

For example, the shortened signal path 142 is illustrated as follows. The signal path is formed between the first slot, labeled slot 1, that is connected to an interior slot, labeled slot 9, via a modified input interconnection 432. The modified input interconnection 432 is eight slot positions away instead of fifteen slot positions if the first slot, labeled slot 1, and the last slot, labeled slot 15, were connected as in typical topologies. Similarly, the last slot, labeled slot 15, is connected to an interior slot, labeled slot 7, via a modified output interconnection 434, which is eight slot positions away. The output of the slot, labeled slot 7, and the input of the slot, labeled slot 9, will remain the same. The modification to the first slot, labeled slot 1, and the last slot, labeled slot 15, form the shortened signal path 142 that approximately sixty percent of the distance between the first slot, labeled slot 1, and the last slot, labeled slot 15. The reduction in the signal path between the first slot, labeled slot 1, and the last slot, labeled slot 15, also requires some adjustments to the interconnections 140 to the output port 124 of the slot labeled 6 and the interconnections 140 to the input port 122 of the slot labeled 10, which are interconnected via a modified interior interconnection 436.

Moreover, the two-dimensional torus topology 200 also preserves the trace routing direction 230 between the input ports 122 and the output ports 124, which enable each slot 400 to be compatible with a variety of electronic modules 360. For example, the electronic modules 360 may include at least one module size selected from a single length and single width module 410, a double length module 420, a triple length module 430, a double width module 440, a triple width module 460, and a double length and double width module 480. The variety in the size of the electronic modules 360 also provides the ability to select different types of electronic modules 360, such as a network switch, a memory module, a storage module, and a compute module. Therefore, a single printed circuit board 100 may receive one or a combination of the sizes and types of electronic modules 360 as illustrated in FIG. 4. FIG. 4 also illustrates the connection at the slot labeled slot 21 the input ports 122 in the slot labeled slot 21 connectable to an input connection 362 on the single length and single width module 410 and the set of output ports 124 connectable to an output connection 364 on the single length and single width module 410. The input port 122 includes a plurality of input pins 472 and the output port 124 includes a plurality of output pins 474. Consistency of the trace routing direction 230 enables the electronic modules 360 to be interchangeably used.

Figure 5:
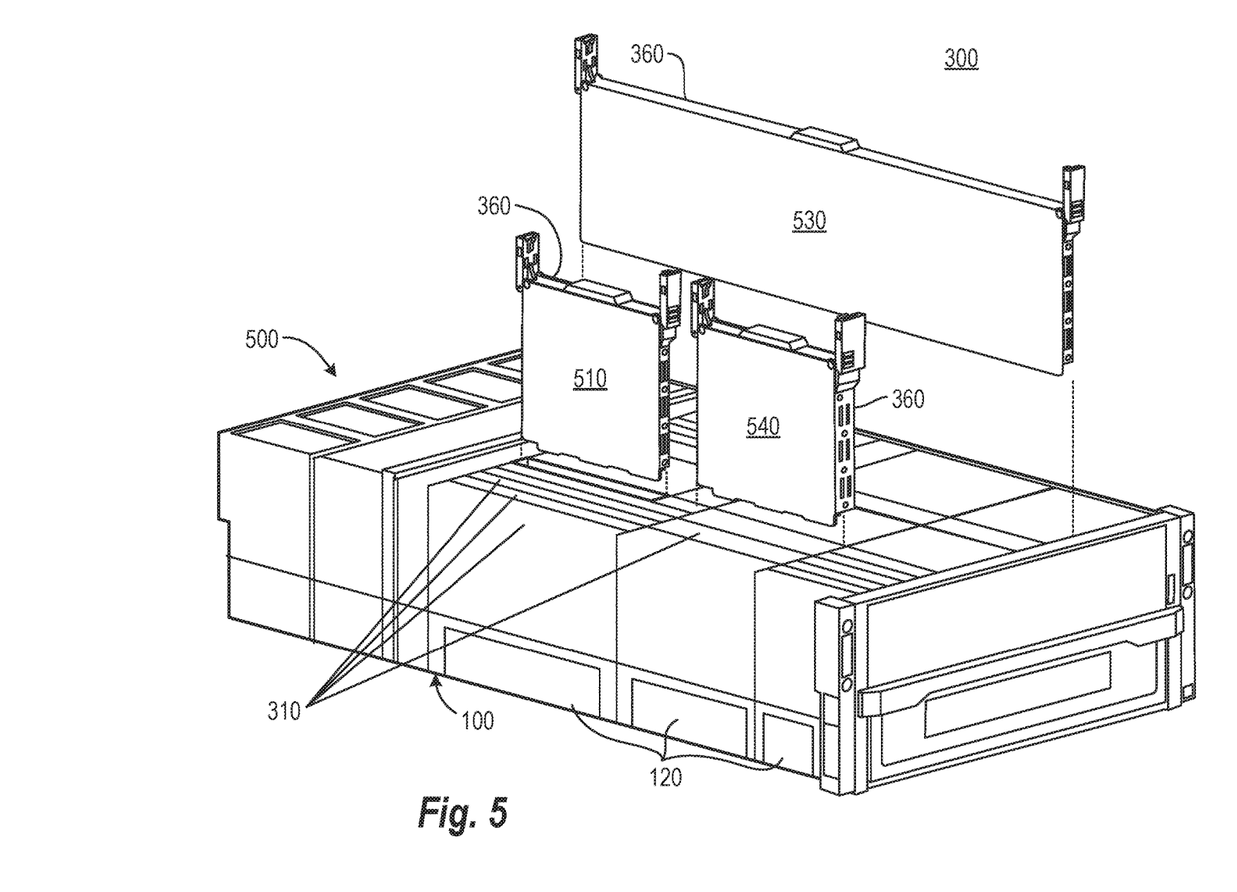
FIG. 5 illustrates a perspective diagram of the system of FIG. 3 according to an example.

FIG. 5 illustrates a perspective diagram of the system 300 of FIG. 3 according to an example. FIG. 5 illustrates a chassis 500 that is formed to receive top-loading server cartridges. The chassis 500 is illustrated to include a printed circuit board 100 that can interchangeable receive the cartridges or electronic modules 360 in each slot 400 along the printed circuit board 100. For example, the electronic modules 360 illustrated include a single length and single width module 410 used as a compute module 510 with a processor that is used for computing solutions or a storage module 510 with at least one hard drive that is used for storage solutions. Another electronic module 360 illustrated is a double width module 440, such as a fan module 540 used to cool the electronic components in the other electronic cartridges 360. A further electronic module 360 illustrated is a triple length module 430, such as a network module 530 or network switch, that is used for network solutions. The two-dimensional torus topology 200 with the same or identical trace routing direction 230 makes the system 300 compatible with a variety of electronic modules 360 and enables the electronic modules 360 to be interchangeably connected to the slots 310 and/or the board connectors 120 of the printed circuit board 100. The two-dimensional torus topology 200 also enables the distinct varieties of electronic modules 360 to be positioned adjacent to each other, logically or physically, such that the interconnections 140 may be formed between different sizes and types of electronic modules. For example, a double width module 440, such as fan module 540, may be interconnected to a single length and single width module 410, such as a compute module 510. Moreover, the two-dimensional torus topology 200 provided herein also reduces the signal path, such that there is a shorter distance between the first and last board connectors 220 (i.e., 220A and 220J of FIG. 2) on the printed circuit board 100 and by, for example, connecting to another board connector 220 (i.e., 220E and 220F of FIG. 2, respectively) that is not directly located in a position physically adjacent to the first and last board connectors 220 (i.e., 220A or 220J of FIG. 2).

Figure 6:
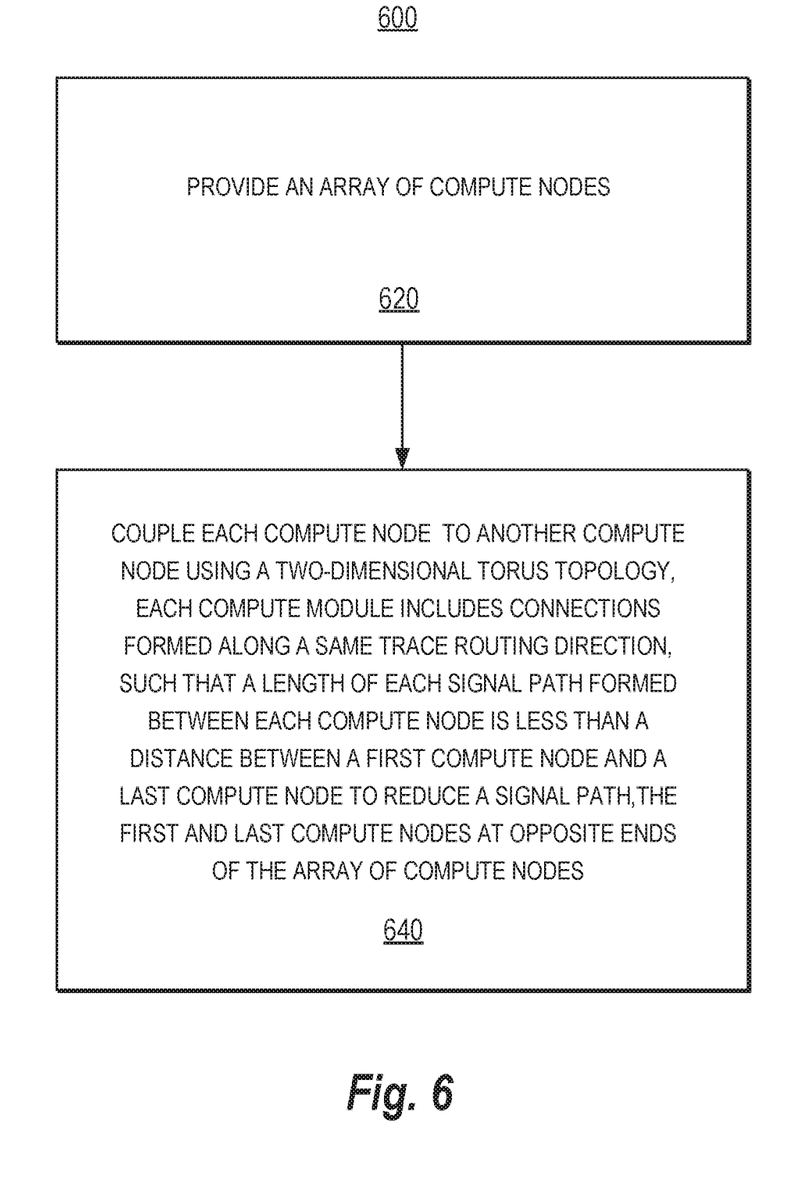
FIGS. 6-7 illustrate flow charts of a method to interconnect compute nodes using a two-dimensional torus topology according to an example.
Figure 7:
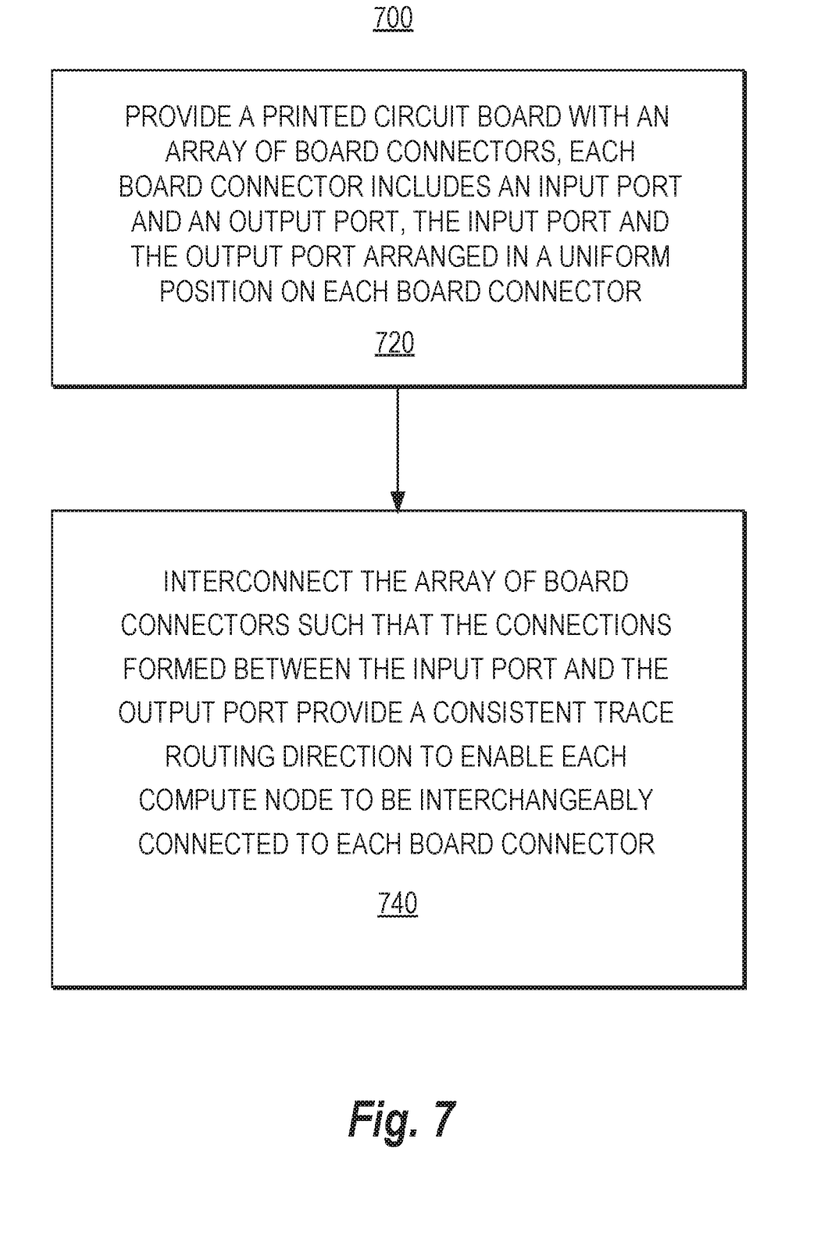

FIGS. 6-7 illustrate flow charts 600, 700 of a method to interconnect compute nodes using a two-dimensional torus topology according to an example. Referring to FIG. 6, an array of compute nodes are provided in block 620. The compute nodes include for example an electronic module. In block 640, each compute node in the array of compute nodes is coupled to another compute node in the array of compute nodes using the two-dimensional torus topology. In the two-dimensional torus topology each compute node connects to another compute node, each compute node has connections formed along a same trace routing direction. The connections are formed such that a length of each signal path formed between each compute node is less than the distance between a first compute node and a last compute node to reduce a signal path. The first and last compute nodes are at opposite ends of the array of compute nodes.

Referring to FIG. 7, the flow chart 700 illustrates further steps of the method of FIG. 6. In block 720, a printed circuit board with an array of board connectors is provided. Each board connector in the array of board connectors includes an input port and an output port. The input port and the output port are arranged in a uniform or consistent position on each board connector. The array of board connectors are interconnected in block 740. The interconnection forms connections between the input port and the output port to provide a consistent trace routing direction which enables each compute node to be interchangeably connected to each board connector. For example, in a server environment each compute node may include one of the following or a combination of the following including a memory module, network switch, storage module, computing module where the modules connected include all the same type of modules, i.e., all storage or a variety of modules, such as one memory, one computer, and one network switch each connected to one another via the printed circuit board.

Although the flow diagrams 600, 700 of FIGS. 6-7 illustrate specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present invention.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A printed circuit board including a two-dimensional torus topology comprising:
    an array of board connectors, each board connector of the array of board connectors formed to each receive an electronic connector;
    an input port and an output port formed on each board connector of the array of board connectors, the set of input ports and the set of output ports arranged on each board connector to provide an identical trace routing direction; and
    a set of interconnections formed to connect each board connector to another board connector in the array of board connectors, the set of interconnections include a shortened signal path between a first board connector and a last board connector, the shortened signal path includes a length less than a distance between the first board connector and the last board connector in the array of board connectors, the first board connector and the last board connector arranged at opposite ends of the printed circuit board.

2. The printed circuit board of claim 1, wherein the shortened signal path comprises a percentage of a distance between the first board connector and the last board connector along a row of the printed circuit board, the percentage is less than one-hundred percent.

3. The printed circuit board of claim 1, wherein the input port includes a plurality of input pins and the output port includes a plurality of output pins.

4. The printed circuit board of claim 1, wherein the printed circuit board comprises a motherboard.

5. The printed circuit boards of claim 1, wherein the input port is positioned at a first position in the board connector and the output port is positioned at a second position in the board connector to provide the identical trace routing direction between the set of interconnections and enable the electronic connectors to be interchangeably inserted into the board connector.

6. A compute system with a two-dimensional torus topology comprising:
    an array of slots formed to receive a plurality of electronic modules;
    a printed circuit board including:
        an array of board connectors, each board connector of the array of board connectors includes an input port and an output port arranged on each board connector to provide an identical trace routing direction and
        a set of interconnections to connect the input port and the output port of each board connector to another board connector, each interconnection of the set of interconnections include a length less than a distance between a first board connector and a last board connector in the array of board connectors to provide a shortened signal path therebetween, the first board connector and the last board connector arranged at opposite ends of the printed circuit board; and
    the plurality of electronic modules, each electronic module coupled to another electronic module via the set of interconnections, each electronic module having at least one input electronic connector and at least one output electronic connector, the at least one input electronic connector formed to connect to the corresponding input port and the at least one output electronic connector formed to connect to the corresponding output port.

7. The compute system of claim 6, wherein the set of interconnections that form along the same trace routing direction include at least one interconnection not directly connected to the slot in a position physically adjacent thereto to reduce a length of the set of interconnections therebetween.

8. The compute system of claim 6, wherein each board connector comprises the input port and the output port arranged uniformly thereon.

9. The compute system of claim 6, wherein the shorter signal path comprises a percent less than one-hundred percent of a distance between the first board connector and the last board connector.

10. The compute system of claim 6, wherein each electronic module comprises at least one module selected from a network switch, a memory module, a storage module, and a compute module.

11. The compute system of claim 6, wherein the array of slots formed to be compatible with the electronic modules including at least one module size selected from a single length and single width module, a double width module, a double length module, a triple length module, and a triple width module.

12. The compute system of claim 6, wherein each slot is formed to interchangeably receive the input electronic connection and the output electronic connection connected to the electronic module selected from at least one of the following: a single length and single width module, a double width module, a double length module, a triple length module, and a triple width module.

13. The compute system of claim 6, wherein each slot is formed to interchangeably receive the input electronic connection and the output electronic connection connected to the electronic module selected from at least one of the following: a network switch, a storage module, and a compute module.

14. A method to interconnect compute nodes using a two-dimensional torus topology comprising:
 providing an array of compute nodes; and
 coupling each compute node in the array of compute nodes to another compute node in the array of compute nodes using the two-dimensional torus topology such that each compute node connects to another compute node, each compute node includes connections formed along a same trace routing direction, at least one of the compute nodes coupled to another compute node such that a length of each signal path formed between each compute node is less than the distance between a first compute node and a last compute node to reduce a signal path, the first and last compute nodes are at opposite ends of the array of compute nodes.

15. The method of claim 14, further comprising:
 providing a printed circuit board with an array of board connectors, each board connector in the array of board connectors includes an input port and an output port, the input port and the output port arranged in a uniform position on each board connector; and
 interconnecting the array of board connectors such that connections form between the input ports and the output ports to provide a consistent trace routing direction to enable each compute node to be interchangeably connected to each board connector.

16. The printed circuit board of claim 1, wherein the input ports are located at a same physical position on each of the board connectors and wherein the output parts are located at a same physical position on each of the board connectors to provide the identical trace routing direction.

17. The printed circuit board of claim 1, wherein the input port is located at the same relative physical location with respect to the output port on each of the board connectors to provide the identical trace routing direction.

18. The compute system of claim 6, wherein the input ports are located at a same physical position on each of the board connectors and wherein the output parts are located at a same physical position on each of the board connectors to provide the identical trace routing direction.

19. The compute system of claim 6, wherein the input port is located at the same relative physical location with respect to the output port on each of the board connectors to provide the identical trace routing direction.

20. The method of claim 14, wherein the connections include an input connection having a same relative physical location with respect to an output connection on each of the compute nodes.

21. The printed circuit board of claim 1, wherein the array of board connectors comprises:
 a first series of consecutive board connectors having a first board connector and a final board connector, each of the board connectors of the first series being serially connected by the set of interconnections directly to an adjacent board connector the first series;
 a second series of consecutive board connectors having a first board connector and a final board connector, each of the board connectors of the second series being serially connected by the set of interconnections directly to an adjacent board connector of the second series; and
 a third series of at least one board connector, the third series having an output connected by the set of interconnections directly to the first board connector of the first series and an input connected by the set of interconnections directly to the final board connector the second series.

22. The compute system of claim 6, wherein the array of board connectors comprises:
 a first series of consecutive board connectors having a first board connector and a final board connector, each of the board connectors of the first series being serially connected by the set of interconnections directly to an adjacent board connector the first series;
 a second series of consecutive board connectors having a first board connector and a final board connector, each of the board connectors of the second series being serially connected by the set of interconnections directly to an adjacent board connector of the second series; and
 a third series of at least one board connector, the third series having an output connected by the set of interconnections directly to the first board connector of the first series and an input connected by the set of interconnections directly to the final board connector the second series.

23. The method of claim 14, wherein the array of compute nodes comprises:
 a first series of consecutive compute nodes having a first compute node and a final compute node, each of the compute nodes of the first series being serially connected by the set of interconnections directly to an adjacent compute node the first series;
 a second series of consecutive compute nodes having a first compute node and a final compute node, each of the compute nodes of the second series being serially connected by the set of interconnections directly to an adjacent compute node of the second series; and
 a third series of at least one compute node, the third series having an output connected by the set of interconnections directly to the first compute node of the first series and an input connected by the set of interconnections directly to the final compute node the second series.

* * * * *